(12) United States Patent
Takaya

(10) Patent No.: US 7,601,594 B2
(45) Date of Patent: Oct. 13, 2009

(54) METHOD FOR FABRICATING SEMICONDUCTOR MEMORY

(75) Inventor: Koji Takaya, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 35 days.

(21) Appl. No.: 12/073,881

(22) Filed: Mar. 11, 2008

(65) Prior Publication Data
US 2008/0254585 A1 Oct. 16, 2008

(30) Foreign Application Priority Data
Apr. 11, 2007 (JP) ............................. 2007-104176

(51) Int. Cl.
*H01L 21/8247* (2006.01)
(52) U.S. Cl. .............................. 438/267; 257/E21.179
(58) Field of Classification Search ......... 438/257–267; 257/E21.179
See application file for complete search history.

(56) References Cited

U.S. PATENT DOCUMENTS 6,358,799 B2 * 3/2002 Odanaka et al. ............. 438/267

FOREIGN PATENT DOCUMENTS

| JP | 2002-118255 | 4/2002 |
| JP | 2005-064295 | 3/2005 |
| JP | 2006-024680 | 1/2006 |

* cited by examiner

*Primary Examiner*—Richard A. Booth
(74) *Attorney, Agent, or Firm*—Rabin & Berdo, PC

(57) ABSTRACT

A method for fabricating a semiconductor memory, the method including: forming an element isolation region in a concave portion of the semiconductor substrate; forming a layer of a gate electrode material so as to cover the concave portion and the element isolation region; forming a gate electrode by forming a mask on a surface of the layer of a gate electrode material so that a height from an upper surface of the convex portion to the surface of the mask is higher than a height from the surface of the element isolation region to the upper surface of the convex portion and by patterning the layer of the gate electrode material; forming a charge storing layer at least one of side surfaces of the gate electrode in contact with the convex portion; and forming a sidewall on a part of the charge storing layer.

6 Claims, 11 Drawing Sheets

B-B

A-A

METHOD FOR FABRICATING SEMICONDUCTOR MEMORY

CROSS-REFERENCE TO RELATED APPLICATION

This application claims priority under 35 USC 119 from Japanese Patent Application No. 2007-104176. The disclosure of which is incorporated by reference herein.

BACKGROUND OF THE INVENTION

1. Field of the Invention

The present invention relates to a method for fabricating a semiconductor memory and more specifically to a method for fabricating a semiconductor memory that can be utilized as a semiconductor non-volatile memory.

2. Description of Related Art

Recently, a semiconductor non-volatile memory is utilized as a memory of low-power consumption devices such as a cellular phone since it requires no electric power for retaining memory information.

As one of the semiconductor non-volatile memories a semiconductor non-volatile memory, in which a charge-storing layer is provided so as to sandwich a gate electrode, has been proposed (see Japanese Patent Application Laid-open (JP-A) No. 2006-24680 for example). Such semiconductor non-volatile memory functions as a memory by storing electrons in the charge storing layer. That is, it functions as a memory by changing a current value of a memory (transistor) depending on whether or not electrons exist in the charge storing layer and by reading the current value as data of "0" or "1".

Meanwhile, refinement of elements used in the semiconductor memory is remarkable advanced lately and the same tendency is also seen in the field of semiconductor devices. For example, a fin-type field effect transistor has been proposed as a three-dimensional MIS type semiconductor memory (see JP-A No. 2002-118255 for example), which has a structure in which a sidewall insulating film is formed at a side surface of a convex thin film Si layer (fence) and a gate electrode.

However, it becomes difficult to implant impurities into a predetermined position during implanting of the impurities to source/drain regions formed on the fin, after the sidewall is formed on the fin (fence) of the fin-type field effect transistor. This is because a remaining sidewall becomes a mask for the implanting.

Still more, if a sidewall is not formed, a dimension of a gate is reduced and a width of the gate electrode becomes smaller according to the refinement of the semiconductor non-volatile memory having the charge storing layer. Then, a channel length of the memory becomes shorter to cause a short channel effect and a leakage current to flow between the source regions and the drain region even when the gate is closed (appropriately referred to as "punch-through" hereinafter).

SUMMARY OF THE INVENTION

The present invention has been made in view of the problems described above and provides a method for fabricating a highly reliable semiconductor memory.

As a result of ardent study, the inventor has found that the abovementioned problem of the semiconductor memory may be solved by using a method for fabricating the semiconductor memory described below.

That is, according to a first aspect of the invention, there is provided a method for fabricating a semiconductor memory having a semiconductor substrate having a concave portion and a convex portion, an element isolation region, a gate electrode and a charge storing layer, the method including:

(a) forming the element isolation region in the concave portion of the semiconductor substrate;

(b) forming a layer made of a gate electrode material so as to cover the concave portion of the semiconductor substrate and the element isolation region;

(c) forming the gate electrode by forming a mask on a surface of the layer made of a gate electrode material so that a height from an upper surface of the convex portion to the surface of the mask is higher than a height from the surface of the element isolation region to the upper surface of the convex portion and by patterning the layer made of the gate electrode material;

(d) forming the charge storing layer at least one of side surfaces of the gate electrode in contact with the convex portion of the semiconductor substrate; and (e) forming a sidewall on at least a part of the charge storing layer.

According to the method for fabricating the semiconductor memory of the first aspect of the invention, the height from the upper surface of the convex portion (referred to appropriately as "active region" hereinafter) to the surface of the mask is higher than the height from the surface of the element isolation region to the upper surface of the active region (referred to appropriately as "height of the active region" hereinafter). Therefore, so that the sidewall remains only on the side surface of the gate electrode and does not remain on the side surface of the active region at the time of forming the sidewall by the anisotropic etching. Accordingly, it is possible to fabricate the highly reliable semiconductor memory because the impurities such as P and B may be doped (implanted) to the active region at the time of implanting the impurities to form the source/drain regions. It becomes possible to accurately fabricate the semiconductor memory that accommodates the further refinement by using the fabrication method, in which a sidewall does not remain on the side surface of the active region.

According to the method for fabricating the semiconductor memory of a second aspect of the invention, the layer made of the gate electrode material is formed so that a height from an upper surface of the convex portion to the upper surface of the layer made of the gate electrode material is higher than a height from the surface of the element isolation region to the upper surface of the convex portion.

According to the method for fabricating the semiconductor memory of the second aspect of the invention, since the height from the upper surface of the convex portion to the surface of the layer made of the gate electrode material (referred to appropriately as "a height of the gate electrode" hereinafter) is higher than the height of the active region, the sidewall does not remain on the side surface of the active region and remains only on the side surface of the gate electrode regardless of the height of the mask. Accordingly, it becomes possible to shorten a fabrication time because it is sufficient for the height of the mask to be a minimum film thickness for a photolithographic etching process in forming the gate electrode.

According to the method for fabricating the semiconductor memory of a third aspect of the invention, the convex portion includes a channel forming region, an extension forming region provided so as to sandwich the channel forming region, and source/drain forming regions provided so as to sandwich the channel forming region and the extension forming region; the forming of the gate electrode (c) includes forming of the gate electrode on the channel forming region; and the forming of the sidewall (e) includes:

(e1) forming a sidewall material on the semiconductor substrate on which the charge storing layer is formed; and (e2) exposing the source/drain regions by anisotropic etching the sidewall material and the charge storing layer.

According to the method for fabricating the semiconductor memory of the third aspect of the invention, it becomes possible to shorten the fabrication time because the sidewall material and the charge storing layer are etched in the same time, in addition to the effects of the first and second aspects of the invention.

According to the method for fabricating the semiconductor memory of a fourth aspect of the invention, the method further includes:

(f) forming the extension region in the extension forming region after the forming of the gate electrode (c) and before the forming of the charge storing layer (d); and (g) forming the source/drain regions after the forming of the sidewall (e).

According to the method for fabricating the semiconductor memory of the fourth aspect of the invention, it is possible to fabricate the highly reliable semiconductor memory in which punching-through is suppressed because the distance between the source and drain regions may be optimized and the gate length may be set to a predetermined length, in addition to the effects of the first through third aspects of the invention.

Thus, it is possible to provide the method for fabricating the highly reliable semiconductor memory by the invention.

BRIEF DESCRIPTION OF THE DRAWINGS

Preferred exemplary embodiments of the present invention will be described in detail based on the following figures, wherein.

DETAILED DESCRIPTION OF THE INVENTION

A best mode for carrying out a method for fabricating a semiconductor memory of the present invention will be explained below with reference to the drawings. It is noted that an overlapped explanation thereof may be occasionally omitted.

<Method for Fabricating Semiconductor Memory>

The method for fabricating the semiconductor memory of the invention is a method for fabricating a semiconductor memory, which includes a semiconductor substrate, an element isolation region, a gate electrode and a charge storing layer, and the method includes a step of forming the element isolation region in concave portions of the semiconductor substrate having irregular portions (concave/convex portions), a step of forming a layer made of a gate electrode material so as to cover the concave portions of the semiconductor substrate having the irregular portions and the element isolation region, a step of forming the gate electrode by forming a mask so that a height from an upper surface of the convex portion to a surface of the mask formed on the surface of the layer made of the gate electrode material is higher than a height from the surface of the element isolation region to the upper surface of the convex portion and by patterning the layer made of the gate electrode material, a step of forming the charge storing layer at least one of side surfaces of the gate electrode in contact with the convex portion of the semiconductor substrate having the irregular portions and a step of forming a sidewall on at least a part of the charge storing layer.

Preferably, the layer made of the gate electrode material is formed so that the height from the upper surface of the convex portion to the upper surface of the layer made of the gate electrode material is higher than the height from the surface of the element isolation region to the upper surface of the convex portion.

Each of the steps will be explained below with reference to FIGS. 1 through 8 seen from a section along a line A-A of a semiconductor memory 100 in FIG. 10.

[Element Isolation Region Forming Step]

The method for fabricating the semiconductor memory of the invention includes the step of forming the element isolation region in the concave portion of the semiconductor substrate having the irregular portions.

Figure 1:
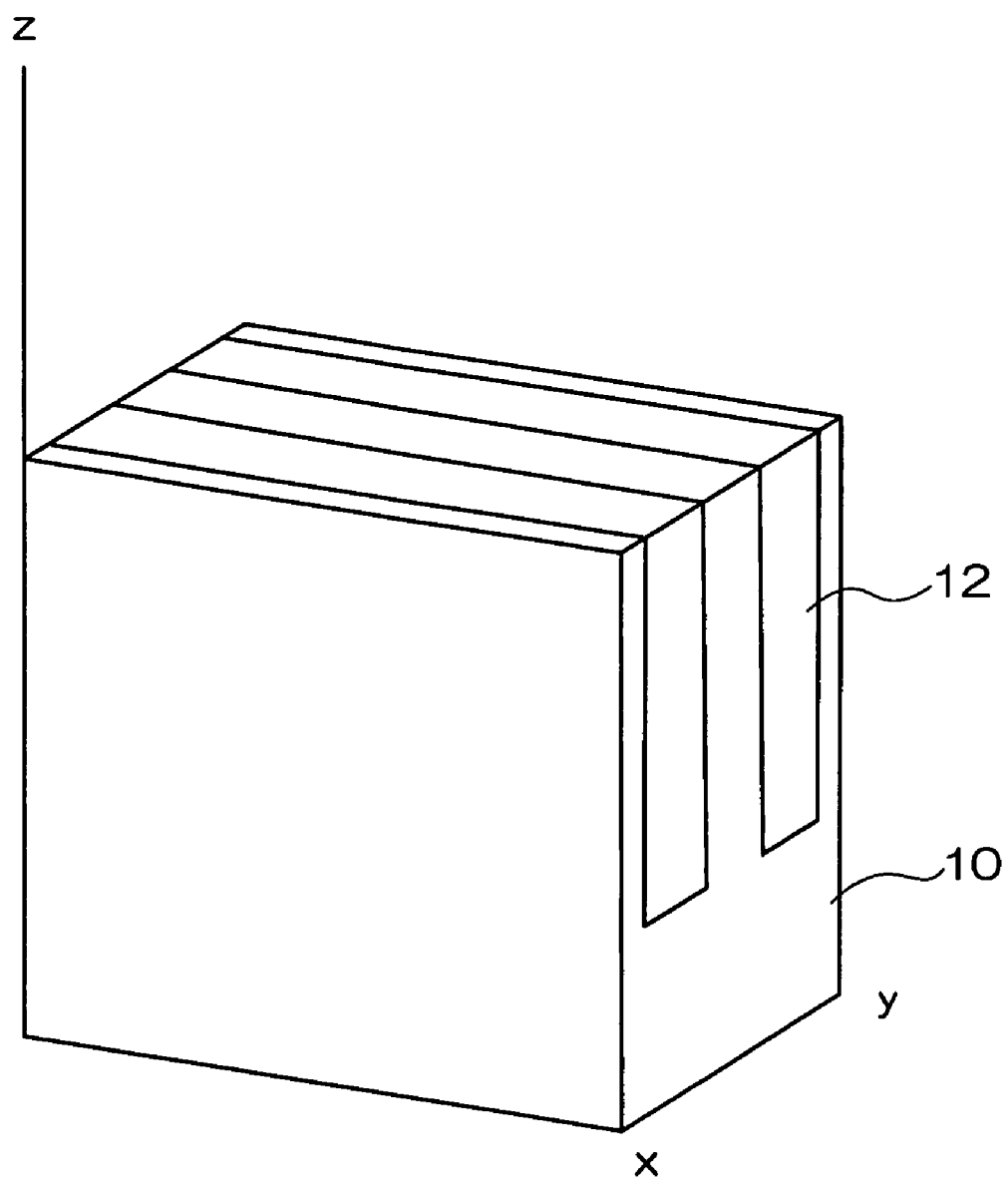
FIG. 1 is a sectional perspective view showing a step for forming an element isolation region in a concave portion of a semiconductor substrate having irregular portions in a method for fabricating a semiconductor memory of an embodiment of the invention.
Figure 2:
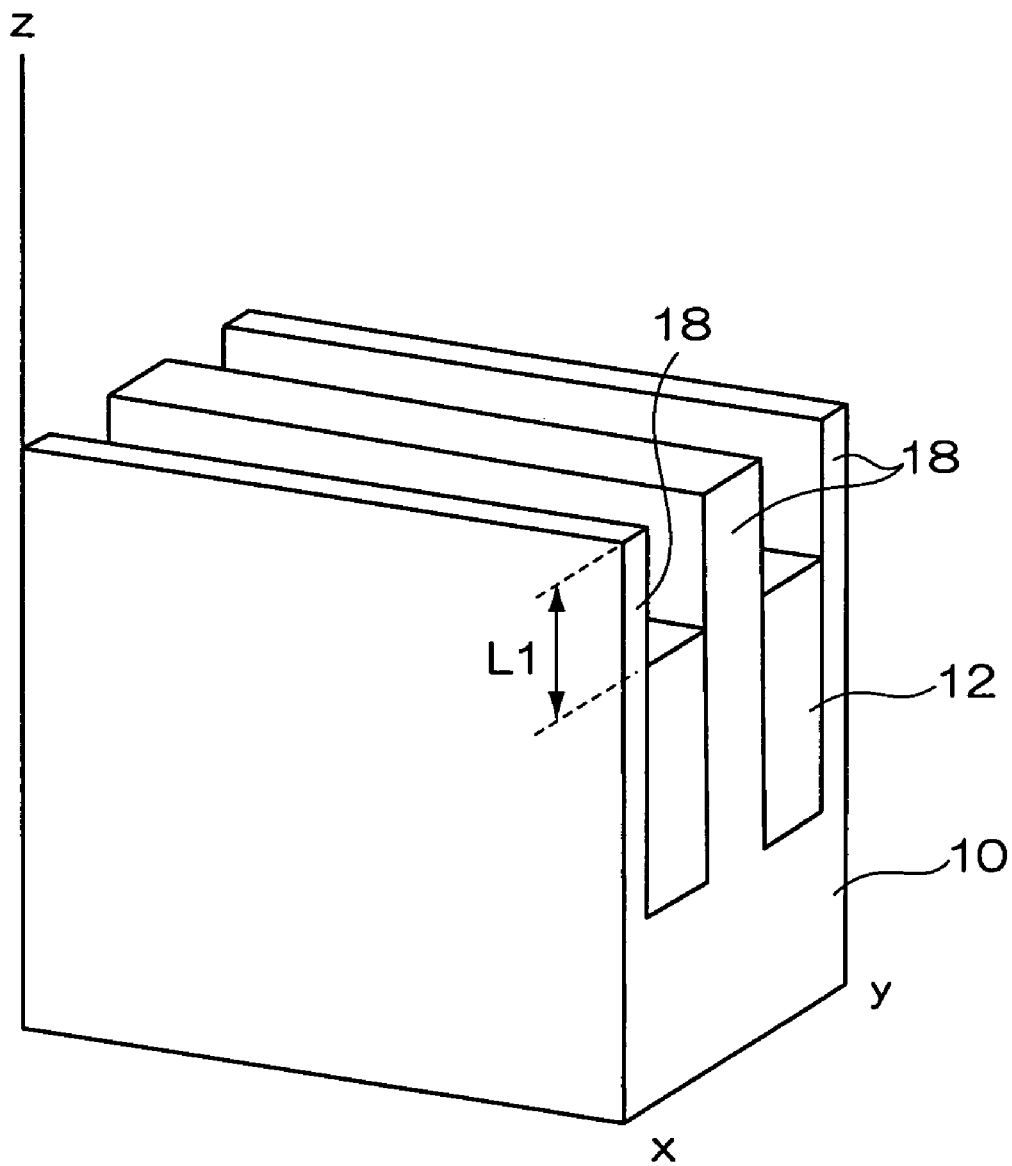
FIG. 2 is a sectional perspective view showing the step for forming step for forming an active region and the element isolation region in the method for fabricating the semiconductor memory of the embodiment of the invention.

As shown in FIG. 1, the irregular portions is formed on a surface of a semiconductor substrate 10 by means of anisotropic etching, the element isolation region 12 is formed in the concave portion and an insulating layer is buried in the concave portion. Then, as shown in FIG. 2, the element isolation region 12 is etched by a predetermined height L1 of an active region 18.

The active region 18 is not specifically limited as long as it has a height and width necessary for forming source and drain regions and for allowing a drain current to sufficient flow.

[Semiconductor Substrate having Irregular Portions]

The semiconductor substrate 10 having the irregular portions of the present invention has the convex portion for forming the active region 18 as described later. Furthermore, a bottom of the concave portion of the semiconductor substrate 10 is cleaned by using ashing and wet processing, and a damaged part is removed by RIE after etching the semiconductor substrate 10. Then, the element isolation region 12 described later is formed in the concave portion. It is noted that a gate insulating film (not shown) is formed in advance on a surface of the convex portion of the semiconductor substrate 10 before forming the element isolation region 12.

The convex portion of the semiconductor substrate 10 having the irregular portions has a channel forming region, an extension forming region provided so as to sandwich the channel forming region and source/drain forming regions provided so as to sandwich the channel forming region and the extension forming region.

A SOI substrate (a substrate having a structure in which $SiO_2$ is inserted between a Si substrate and a surface Si layer) or a Si substrate may be used as the semiconductor substrate 10. Concentration of impurity of the substrate is around $5\times10^{15}/cm^3$ and a surface orientation of its main surface is (100) for example.

[Element Isolation Region]

The element isolation region 12 of the invention is formed by burying the concave portion by using CVD and by depositing to a height leveled at least with an upper surface of the active region 18 in this step. Specifically, $TEOS-SiO_2$ is deposited by using the CVD. After that, the $TEOS-SiO_2$ layer is flattened (planarized) so as to leveled with the upper surface of the convex portion of the semiconductor substrate 10 by means of CMP (Chemical Mechanical Polishing) or the like.

A material of the element isolation region 12 is not specifically limited as long as it has an insulating quality and may be made of, beside $SiO_2$ and the like, $TEOS-SiO_2$ formed by using TEOS as reaction gas, $TEOS-O_3$—$SiO_2$ formed by using $TEOS-O_3$ CVD and $HDP-SiO_2$ formed by using HDP (High Density Plasma) CVD.

After that, the element isolation region 12 having a thickness of 500 nm for example may be formed in the concave portion of the semiconductor substrate 10 and the active region 18 may be formed at the same time, by etching back the $TEOS-SiO_2$ layer by using the RIE method for example as shown in FIG. 2.

[Gate Insulating Film]

In the present invention, a gate insulating film (not shown) is formed in advance on the exposed surface of the semiconductor substrate 10 before forming the element isolation region 12.

The gate insulating film is formed on the exposed semiconductor substrate 10 by using a radical oxidation and is, for example, a $SiO_2$ film whose thickness is 10 nm or less. It is possible to form a uniform gate insulating film having no dispersion of thickness on the surface of the semiconductor substrate 10 by the radical oxidation by utilizing its characteristics that it can form only a predetermined thickness of $SiO_2$ film at a predetermined temperature.

Beside the radical oxidation, a SiON film that is an oxinitride film may be used for example. The SiON film may be formed by forming a normal thermal oxidation film and by nitriding its surface by gas containing nitrogen.

Furthermore, beside the $SiO_2$ and SiON films, a so-called a high dielectric insulating film (high-K film) such as $Ta_2O_5$ (tantaloxide), an $Al_2O_3$ film, a $La_2O_3$ film, a $HfO_2$ film, a $ZrO_2$ film and the like may be used.

[Gate Electrode Material Forming Step]

The method for fabricating the semiconductor memory of the invention includes the step of forming a layer made of a gate electrode material so as to cover the convex portion of the semiconductor substrate having the irregular portions and the element isolation region.

In the method for forming the semiconductor memory of the invention, a mask material (not shown) is formed on a surface of a layer 36 made of the gate electrode material to pattern the gate electrode described later.

Figure 3:
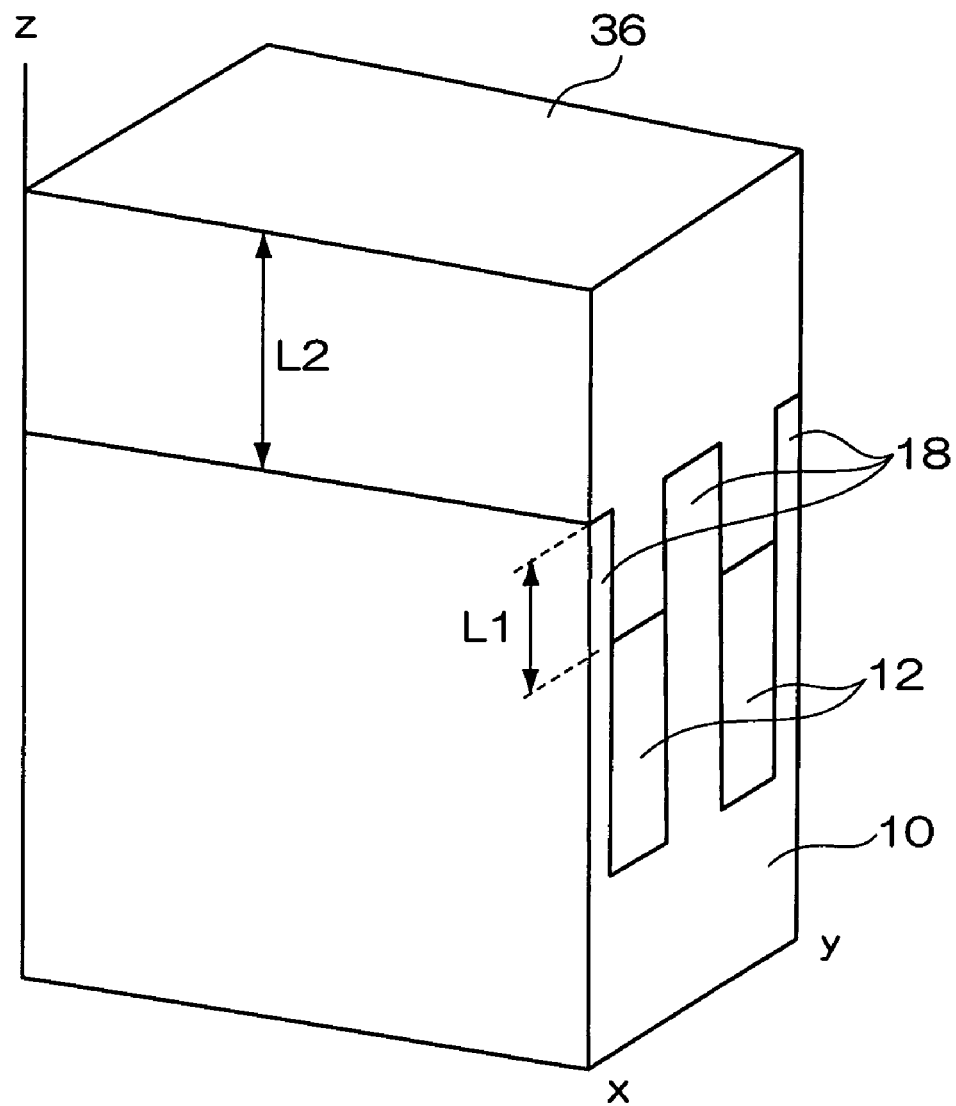
FIG. 3 is a sectional perspective view showing a step for forming a gate electrode material layer made of a gate electrode material so as to bury gate electrode wiring grooves in the method for fabricating the semiconductor memory of the embodiment of the invention.

As shown in FIG. 3, the layer 36 made of the gate electrode material is formed after forming the gate insulating film (not shown) so that a sum of a height L2 of the layer 36 made of the gate electrode material and a thickness of the mask (not shown) formed on the surface of the layer 36 to form the gate electrode (a total height) is higher than a height L1 of the active region 18.

Furthermore, it is preferable to form the layer made of the gate electrode material so that a height from an upper surface of the convex portion to the surface of the layer made of the gate electrode material is higher than a height from the surface of the element isolation region to the upper surface of the convex portion. That is, the layer 36 made of the gate electrode material is formed so that the height L2 of the layer 36 made of the gate electrode material is higher than the height L1 of the active region 18 in FIG. 3. Thereby, it becomes unnecessary to thicken the mask (not shown) exceeding a predetermined thickness and to shorten a processing time.

[Layer Made of Gate Electrode Material and Mask]

The layer 36 made of the gate electrode material is formed by depositing poly-crystal Si by means of CVD for example into which impurities are doped. Then, a resist film is formed as a mask on the poly-crystal Si film so that the gate electrode having a predetermined shape is formed.

Not only the poly-crystal Si but also a well-known material may be used as the gate electrode material of the invention. For example, it is possible to use a metal film, a laminated gate structure of a metal film and a metal film, a laminated gate structure of a poly-crystal Si film and a metal film (so called a poly-metal structure) or a laminated gate structure of a poly-crystal Si film and a siliside film (so called a polyside structure). It is possible to suppress specific resistance (resistivity) of the gate electrode described later in case of using the layer 36 made of the gate electrode material using the metal film, the laminated gate structure of the metal film and the metal film, the poly-metal structure or the polyside structure, as compared to a case of using only poly-crystal Si.

The metal film may be a TiN film, a W film, a WH film, a Ru film, an Ir film, an Al film and the like. An example of the siliside film may be a $CoSi_2$ film, $TiSi_2$ film or the like.

Furthermore, it is possible to change a work function of the gate electrode 14 by adjusting, for example, an orientation of the TiN film when the TiN film is used. Accordingly, it is possible to appropriately change a threshold voltage of a MOSFET by changing the work function of the gate electrode 14.

[Gate Electrode Forming Step]

The method for fabricating the semiconductor memory of the invention includes the step of forming the gate electrode by forming the mask so that the height from the upper surface of the convex portion to the surface of the mask formed on the surface of the layer made of the gate electrode material is higher than the height from the surface of the element isolation region to the upper surface of the convex portion and by patterning the layer made of the gate electrode material. That is, the gate electrode forming step is a step of forming the gate electrode on the channel forming region.

[Height of Gate Electrode, Thickness of Mask and Height of Active Region]

Figure 4:
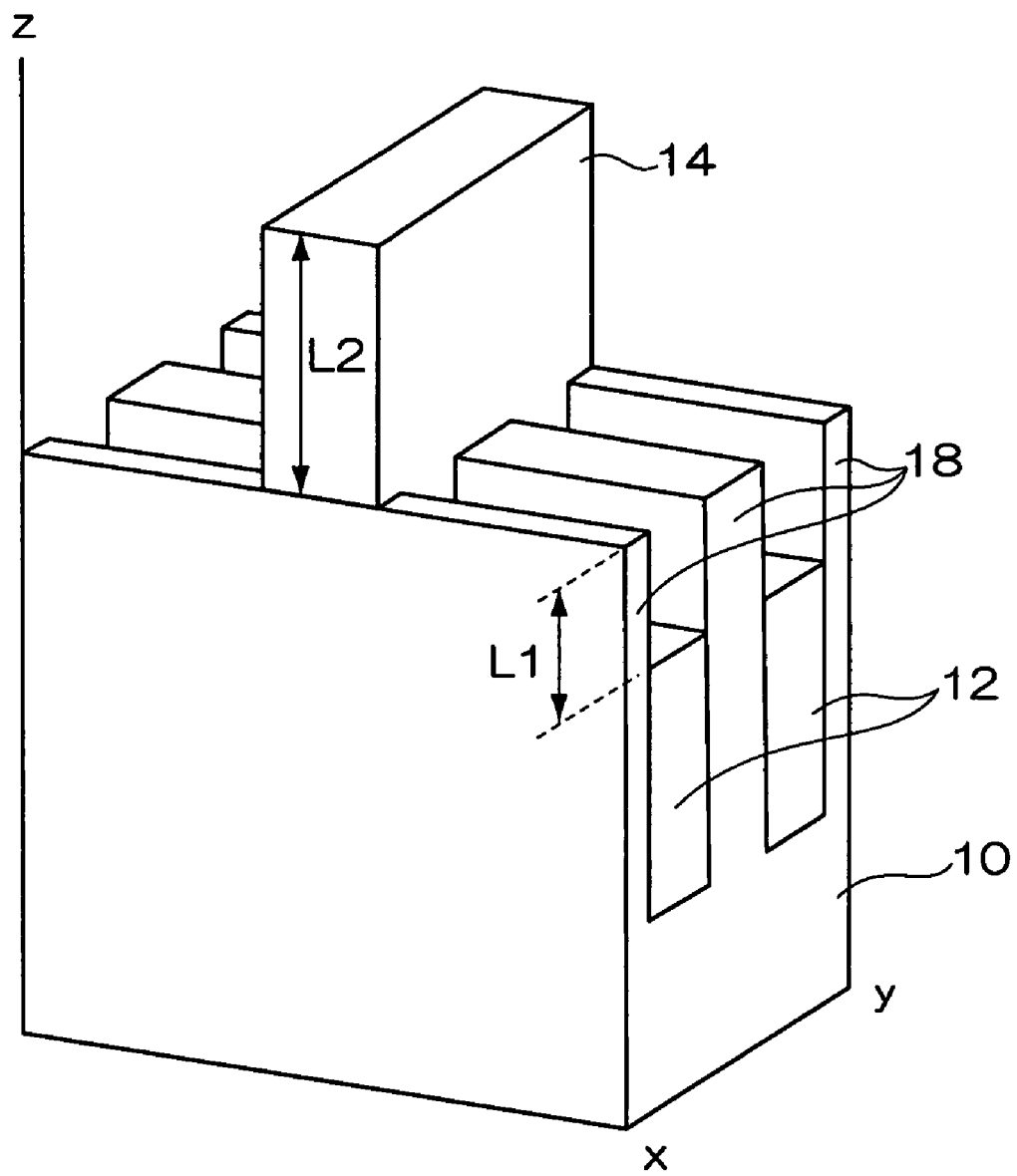
FIG. 4 is a sectional perspective view showing a step for forming the gate electrode by patterning a layer made of the gate electrode material in the method for fabricating the semiconductor memory of the embodiment of the invention.

As shown in FIG. 4, the gate electrode 14 is formed by forming the mask (not shown) on the surface of the layer 36 made of the gate electrode material as shown in FIG. 3 and by etching the layer 36 to the surface of the element isolation region 12 by a known photo-etching. Furthermore, the total height of the height L2 of the gate electrode and the thickness of the mask (not shown) needs to be higher than the height of the active region 18 as described above. Thereby, it is possible to remove a sidewall described later formed on the side surface of the active region 18 and to form the sidewall only on the side surface of the gate electrode described later. Furthermore, preferably the total of the height L2 of the layer 36 made of the gate electrode material and the thickness of the mask material is larger than the height L1 of the active region 18 by one time or more. It is noted that a height of the sidewall formed on the side surface of the gate electrode from the upper surface of the active region 18 must be lower than the height L2 of the gate electrode 14. It is because the mask is removed after forming the gate electrode 14.

Figure 5B:
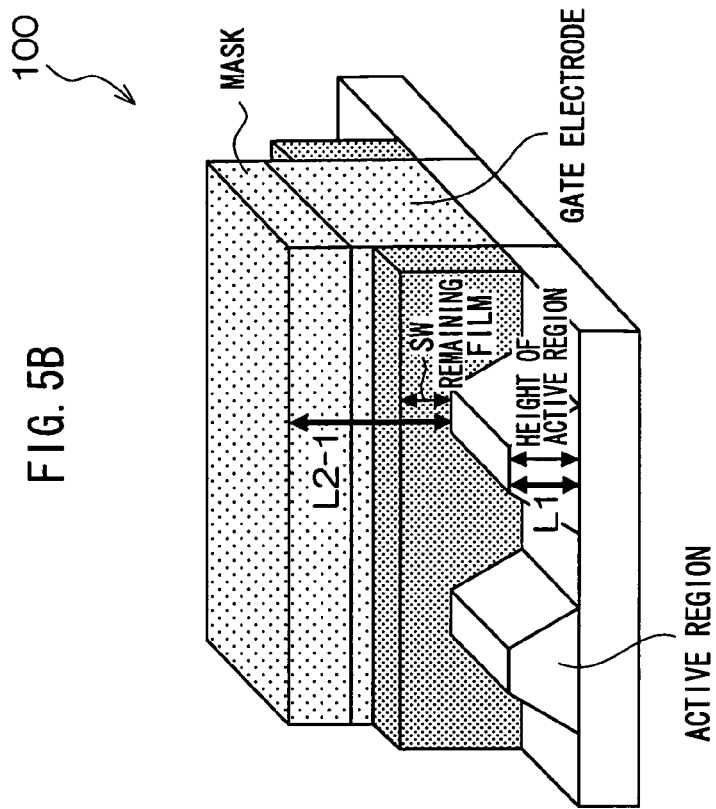
FIG. 5B is a sectional perspective view of the semiconductor memory fabricated by the method of the invention.
Figure 5A:
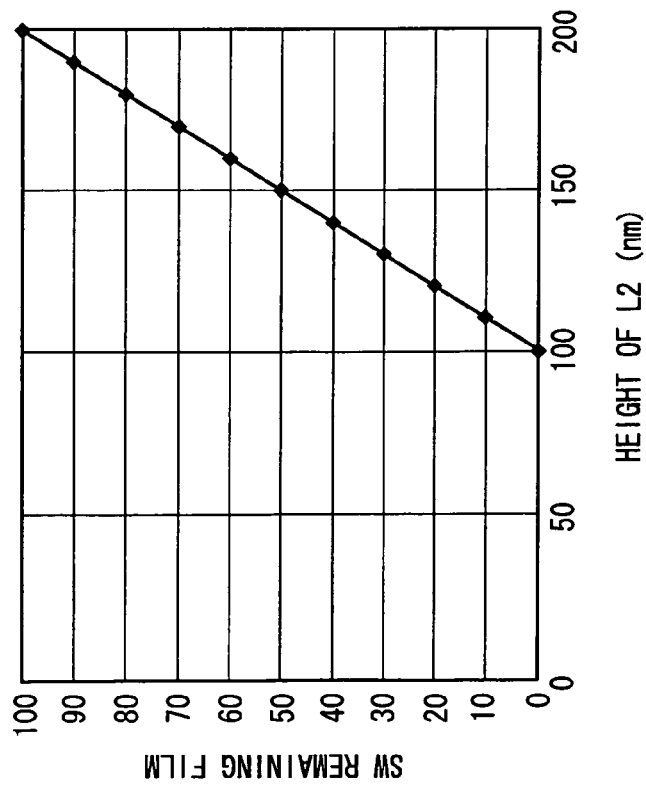
FIG. 5A is a correlation chart showing a relationship between height of L2 and a SW residual film.

Specifically, when a total height (L2-1) of the height L2 and the thickness of the mask (not shown) is 200 nm and the height L1 of the active region 18 is 100 nm as shown in FIGS. 5A and 5B, the sidewall (the SW remaining film) formed on the sidewall of the gate electrode 14 is formed to a height of 100 nm from the surface of the active region 18 by removing the sidewall formed on the sidewall of the active region 18. Furthermore, a sidewall having a height of 3 nm may be fabricated by creating 3 nm of difference between (L2-1) and L1.

More preferably, the height L2 of the gate electrode 14 may be higher than the height L1 of the active region 18. It is possible to shorten the processing time because only the thickness of the mask (not shown) should be adjusted to a thickness necessary for etching the gate electrode material, in addition to that the sidewall is formed only on the side surface of the gate electrode described later by setting this relationship of height.

[Formation of Extension Region]

The method for fabricating the semiconductor memory of the present invention includes the step of forming an extension region after the gate electrode forming step and before the charge storing layer forming step.

Figure 11B:
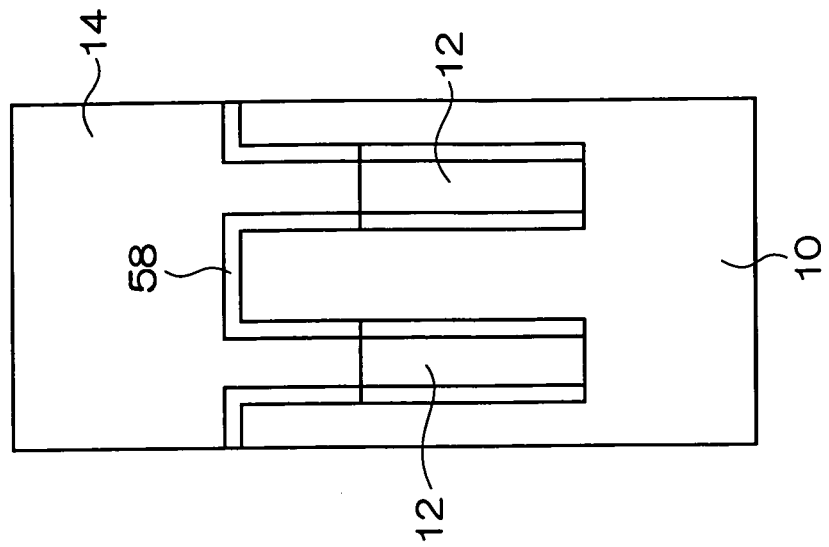
FIG. 11B is a section view taken along a line B-B in FIG. 10.
Figure 11A:
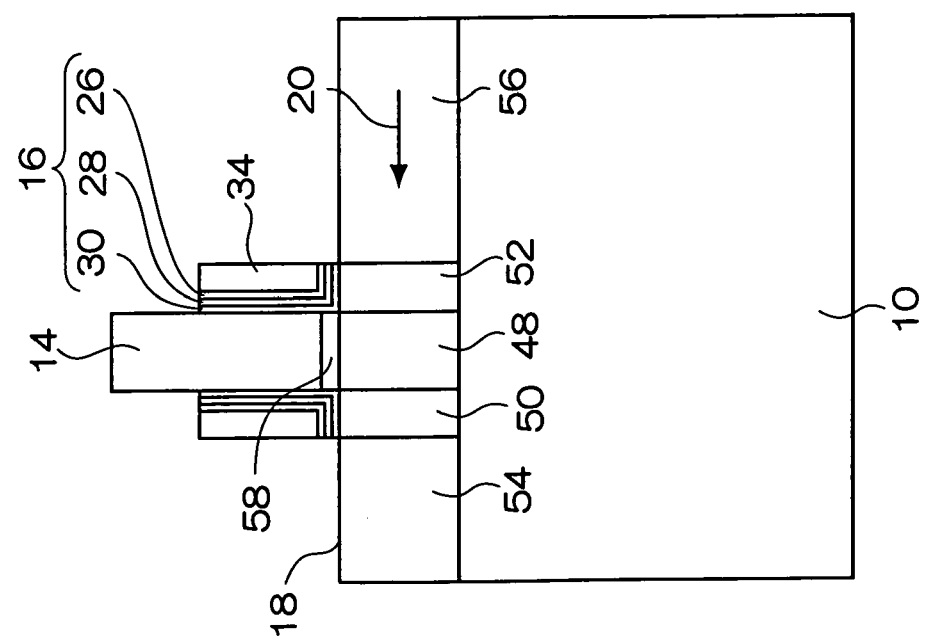
FIG. 11A is a section view taken along a line A-A in FIG. 10.

Specifically, the extension regions 50 and 52 shown in FIG. 11A may be formed by implanting impurities by a known implantation technology in a region within the active region 18, which is not covered by the gate electrode 14, after forming the gate electrode 14, in order to suppress the punch-through caused by the short channel effect. It is preferable to form an extension structure having low and high impurity concentration diffusion layers by the extension regions 50 and 52 as well as the source and drain regions 54 and 56. It is possible to form an oxide film (not shown) by oxidizing by means of radical oxidation or low-temperature RTO for example in order to relax a concentration of electric field at the sidewall and bottom corners of the gate electrode 14 before doping the impurities.

The impurities include P, As, B and others for example.

[Charge Storing Layer Forming Step]

The method for fabricating the semiconductor memory of the present invention includes the step of forming the charge storing layer on at least one of side surfaces of the gate electrode in contact with the convex portion of the semiconductor substrate having the irregular portions.

Figure 6:
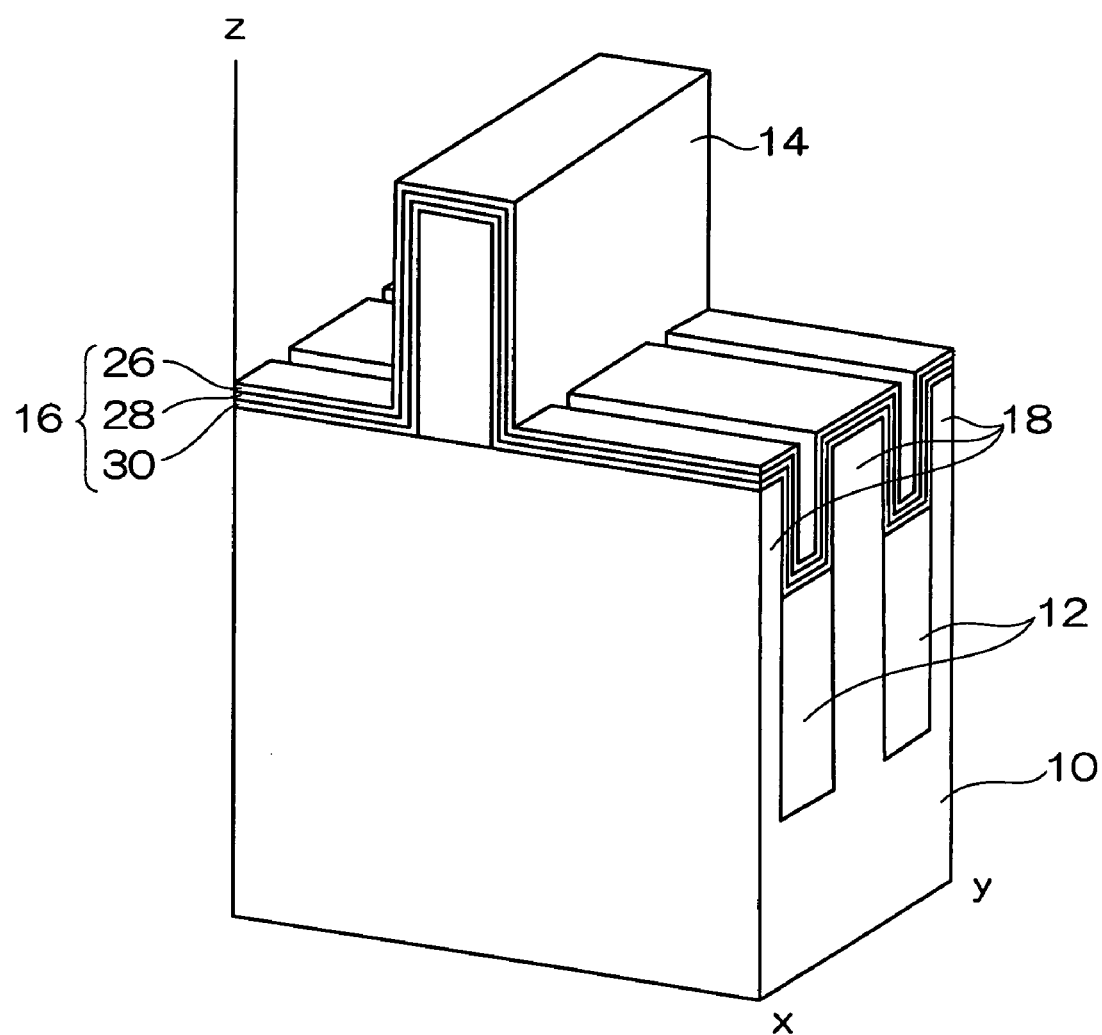
FIG. 6 is a sectional perspective view showing a for forming a charge storing layer at least one of sidewall sections of the gate electrode in the method for fabricating the semiconductor memory of the embodiment of the invention.

As shown in FIG. 6, the charge storing layer 16 is formed on the side surface portions of the gate electrode 14 and the active region 18, on the upper surface of the active region 18, and on the surface of the element isolation region 12.

The charge storing layer 16 is constructed by a laminated structure (ONO: Oxide Nitride Oxide) including a bottom oxide film 30 made of $SiO_2$ formed at first by a known technology, a nitride silicon film 28 made of SiN for example formed on the surface of the bottom oxide film 30 and a top oxide film 26 made of $SiO_2$ for example formed on the surface of the nitride silicon film 28.

In order to be able to readily read and judge the electric charges, the thickness of the charge storing layer 16 is preferably configured with the thickness of the bottom oxide film 30 being 0.0065 μm or more and that of the top oxide film 26 of 0.0065 μm.

The bottom oxide film 30 is formed by a known oxidation technology, the nitride silicon film 28 is formed by CVD and the top oxide film 26 may be formed by thermal oxidation or CVD.

It is preferable to carry out the step of forming the charge storing layer after forming the gate electrode 14. The semiconductor memory fabricated by the method of the present invention is provided with the charge storing layer 16 on the side surface of the gate electrode 14 and the face in contact with the convex portion of the semiconductor substrate 10 having the irregular portions. Thus, it is preferable to provide the charge storing layer 16 after forming the gate electrode 14 from an aspect of its fabrication.

[Sidewall Forming Step]

The method for fabricating the semiconductor memory of the present invention includes the step of forming the sidewall to at least a part of the charge storing layer.

Further, the sidewall forming step includes a step of forming the sidewall material on the semiconductor substrate on which the charge storing layer is formed and a step of exposing the source/drain regions of the convex portion by implementing the anisotropic etching to the sidewall material and the charge storing layer.

Figure 7:
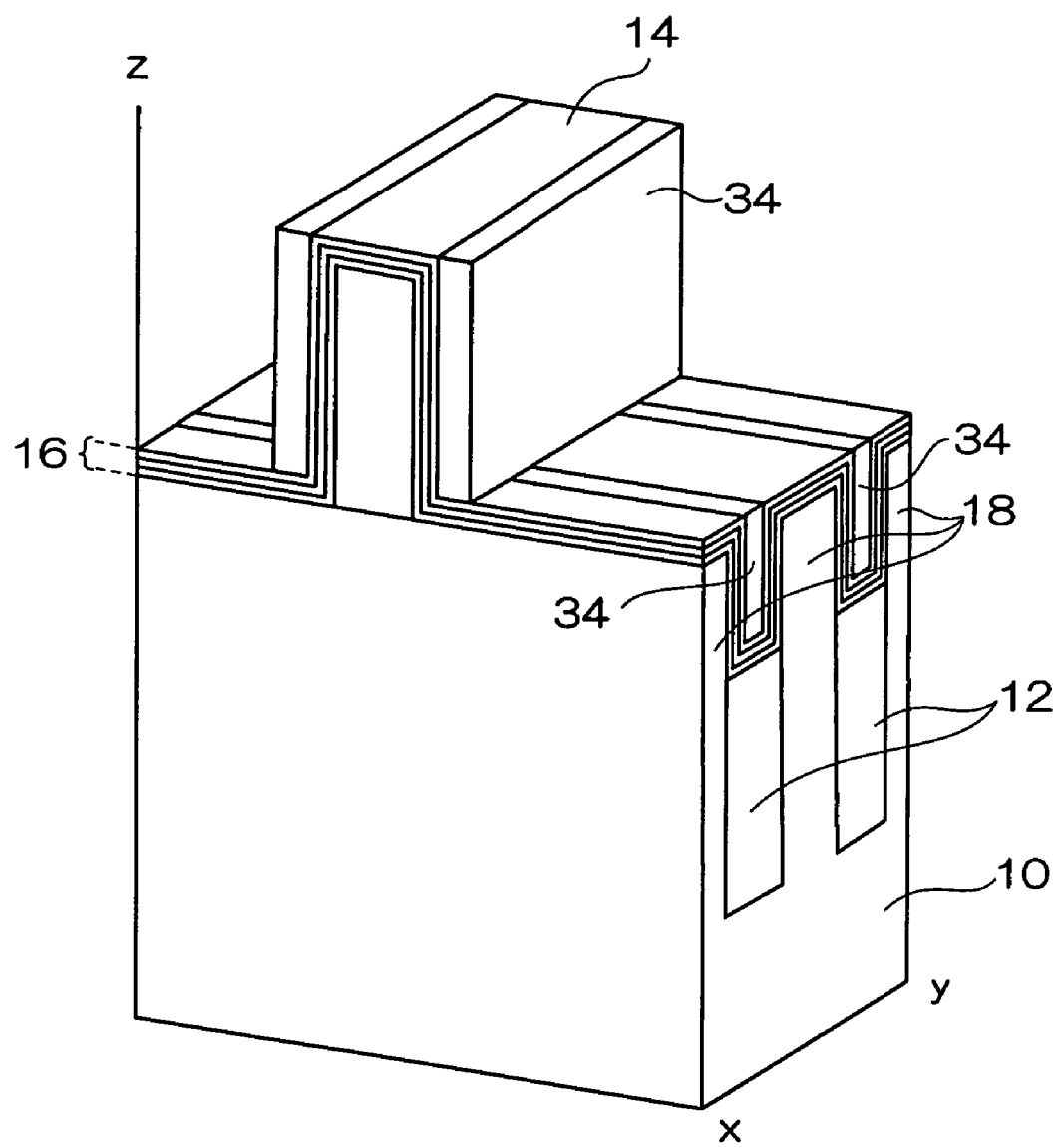
FIG. 7 is a sectional perspective view showing a step for forming a sidewall at least on one of the charge storing layers in the method for fabricating the semiconductor memory of the embodiment of the invention.

A sidewall 34 is formed at least on part of the charge storing layer 16 as shown in FIG. 7.

Figure 8:
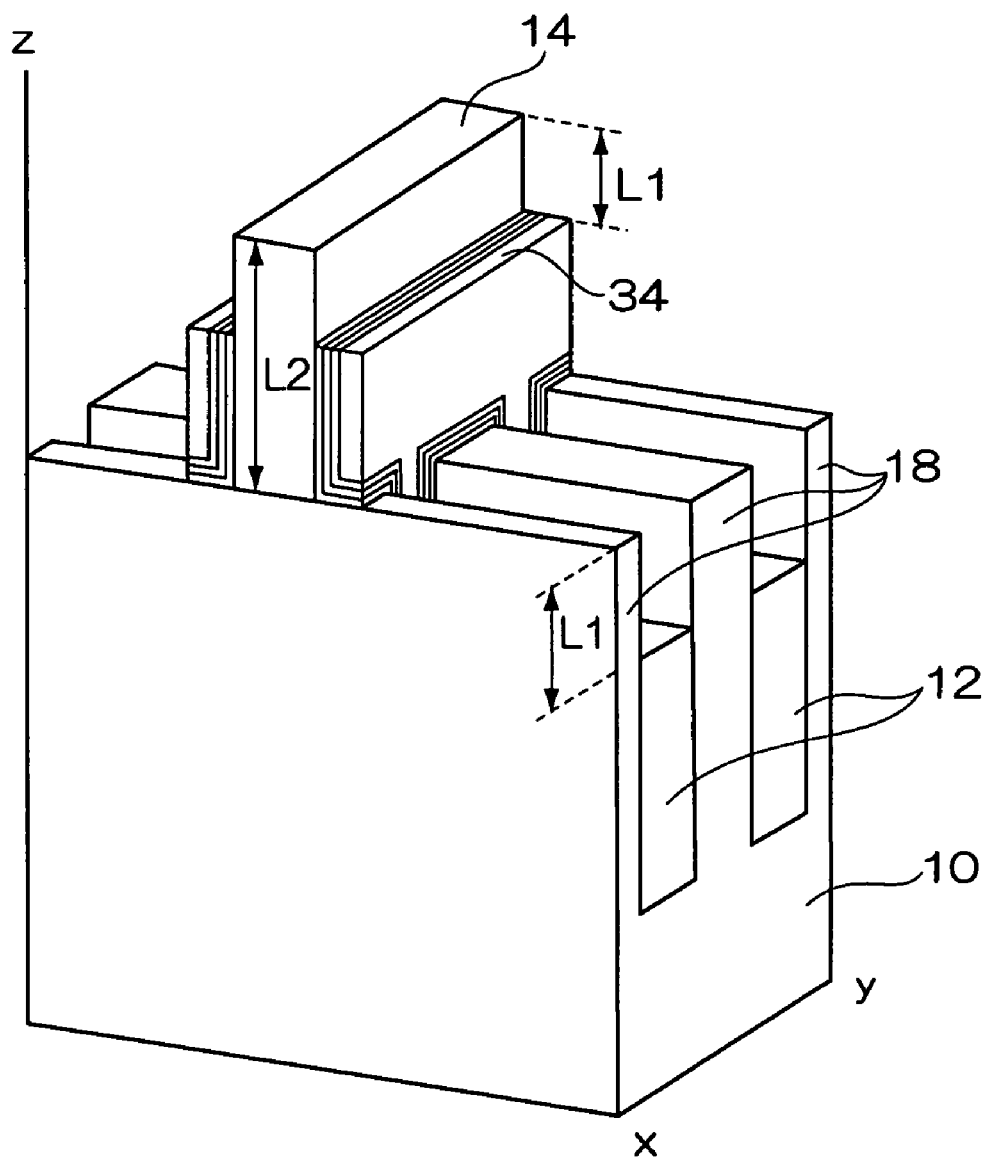
FIG. 8 is a sectional perspective view showing the step for forming the sidewall at least on one of the charge storing layers in the method for fabricating the semiconductor memory of the embodiment of the invention.

The sidewall 34 is formed by way of depositing the sidewall material at first and then by etching so that the sidewall material remains on the gate electrode 14 and in the concave portion of the semiconductor substrate 10. After that, the sidewall material, the convex portion of the semiconductor substrate 10 and the charge storing layer formed on the element isolation region are removed in the same time by the anisotropic etching (RIE) to form the sidewall 34 as shown in FIG. 8.

Here, a height of the sidewall 34 is (L2+thickness of mask (not shown))–L1. In FIG. 8, it is a height obtained by subtracting the height L1 of the active region 18 from the height L2 excluding the height of the mask (not shown). A relationship of these heights is the same with the relationship shown in FIG. 5B.

Still more, the sidewall portion of the active region 18, the upper surface portions and the charge storing layer formed on the upper surface of the gate electrode 14 are also etched when the sidewall 34 is etched so as to form the charge storing layer 16 only on the sidewall portion of the gate electrode 14.

As a material of the sidewall 34, silicon dioxide, silicon nitride and poly-crystal silicon may be used for example.

[Source/Drain Regions Forming Step]

The method for fabricating the semiconductor memory of the present invention includes the step of forming the source/drain regions after the sidewall forming step.

As shown in FIG. 11A, the source region 54 and the drain region 56 are formed after forming the sidewall 34 by implanting ions of P for example into the active region 18 by using the gate electrode 14, the mask (not shown) on the gate electrode 14 and the sidewall 34 a semiconductor memory asks under conditions of 40 KeV of acceleration voltage and around $4\times10^{13}/cm^2$ of doze. As the ions to be implanted, not only P but also As, B and the like may be selected.

It is possible to control a depth of the source/drain regions by conditions of thermal activation and heat treatment after injecting the ions.

Figure 9:
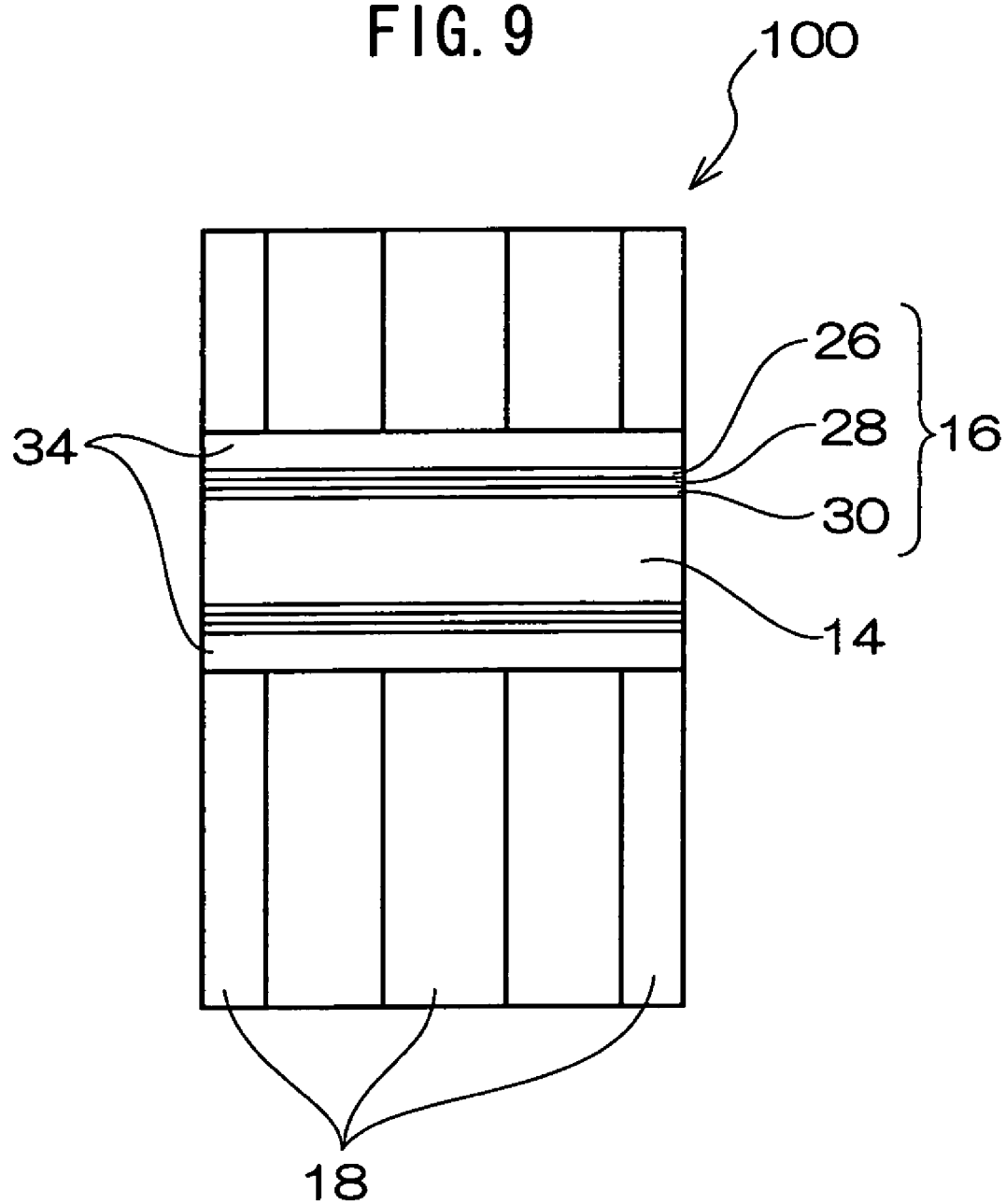
FIG. 9 is a top plan view of the semiconductor memory fabricated by the method of the invention.

The method for fabricating semiconductor memory through these steps leaves no etching residue between the gate electrode 14 as shown in FIG. 9, and can form the source and drain regions 54 and 56 stably as shown in FIG. 11A, so that a method for fabricating the highly reliable semiconductor memory can be obtained.

<Semiconductor Memory>

Figure 10:
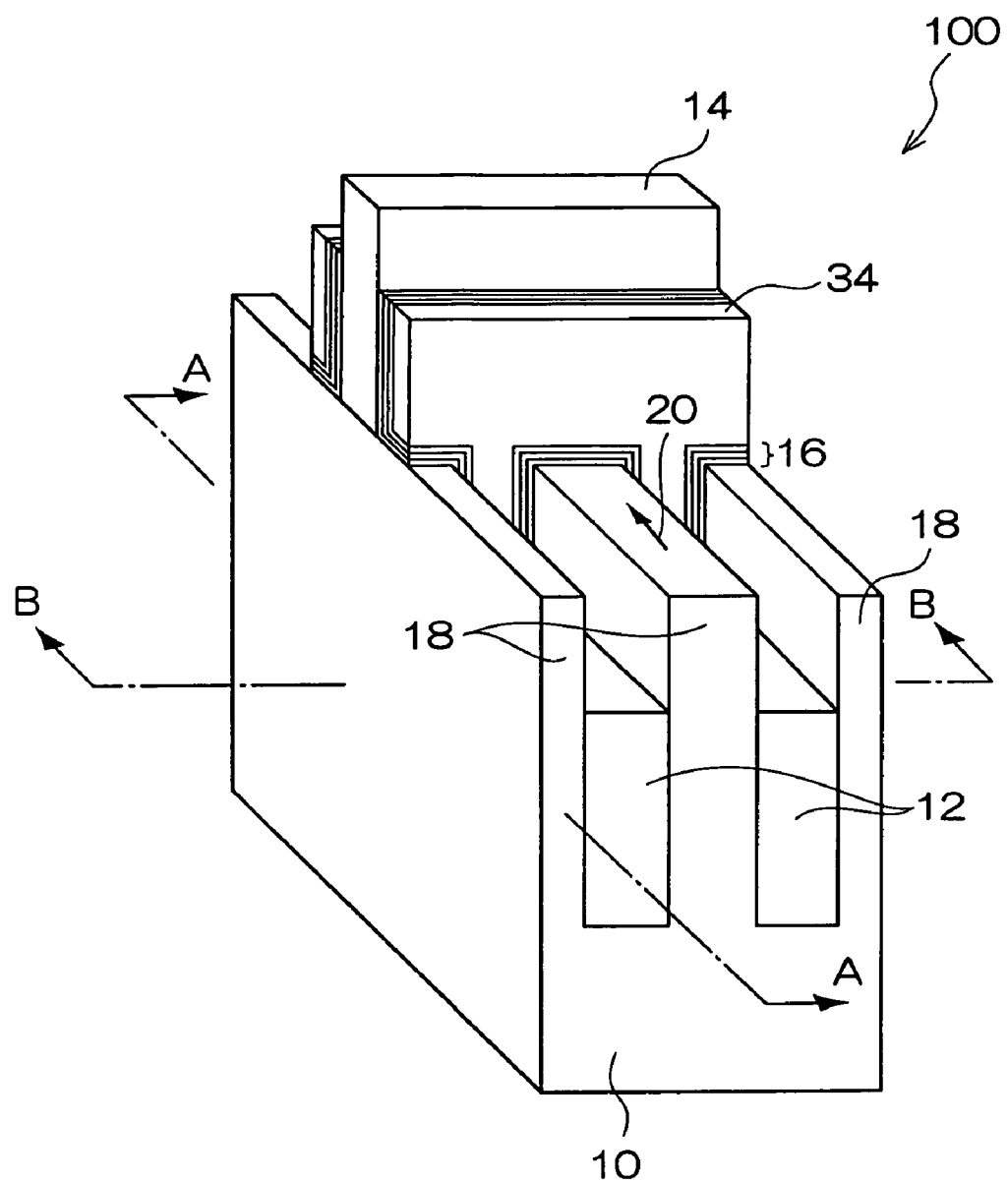
FIG. 10 is a perspective view of the semiconductor memory of the embodiment of the invention.

FIGS. 11A and 11B are section views of the semiconductor memory fabricated by the method of the present invention. FIG. 11A is a section view taken along a line A-A in FIG. 10 and FIG. 11B is a section view taken along a line B-B in FIG. 10.

The semiconductor memory 100 of the present invention includes the semiconductor substrate 10 having the irregular portions, the gate electrode 14 covering at least the both side surfaces of the convex portion of the semiconductor substrate 10, the charge storing layer 16 covering at least the both side surfaces of the gate electrode 14 and the sidewall 34 formed so as to cover a part of the charge storing layer 16. Still more, as shown in the section view of FIG. 11A along the line A-A in FIG. 10, the semiconductor memory 100 includes a channel region 48 formed in a region covered by the gate electrode 14 within the convex portion of the semiconductor substrate 10, the source and drain regions 54 and 56 formed so as to sandwich the channel region 48 within the convex portion of the semiconductor substrate 10, the extension regions 50 and 52 formed at least either the part between the channel region 48 and the source region 54 or between the channel region 48 and the drain region 56 within the convex portion of the semiconductor substrate 10 and a gate insulating film 58 formed between the channel region 48 and the gate electrode 14.

An information recording method of the semiconductor memory of the invention will be explained below.

In the semiconductor memory 100 shown in FIG. 10, a drain current 20 flowing between the source region 54 and the drain region 56 shown in FIG. 11A changes according to modulation of the extension regions 50 and 52 shown in FIG. 11A by existence, quantity and pole (plus or minus) of electric charges within the charge storing layer 16, by storing (trapping) the charges in the nitride silicon film 28 of the charge storing layer 16 or taking out (or injecting charges having opposite pole from the trapped charges) the stored charges from the nitride silicon film 28 of the charge storing layer 16.

Specifically, when electric charges are injected into and stored in the charge storing layer 16 for example, the drain current 20 decreases because a resistance value of the extension regions 50 and 52 shown in FIGS. 11A and 11B increases. When no charge is stored in the charge storing layer 16, however, the drain current 20 fully flows because the resistance value of the extension regions 50 and 52 is low. It is then possible to record or read information of one bit by reading the states when the drain current 20 is decreased and when the drain current 20 flows and by correlating it with a theoretical value "0" or "1". There exist two charge storing layers 16, so that it is possible to record or read information of two bits.

It is noted that the storage of the electric charges to the charge storing layer 16 on the side of the source region 54 is carried out by applying positive voltage to the source region 54 and the gate electrode 14, and by setting the drain region 56 at the ground voltage. Meanwhile, the storing of charges to the charge storing layer 16 on the side of the drain region 56 is carried out by applying positive voltage to the drain region 56 and the gate electrode 14 and by setting the source region 54 at the ground voltage.

While the recording and reading is thus carried out by reading a current value of the drain current 20 flowing between the source region 54 and the drain region 56, the drain current 20 flows while extending in the height direction (length along a direction orthogonal to a plane of the substrate), even if a width along a direction of the plane of the substrate decreases due to the refinement, because the active region 18 where the channel region 48, the source region 54 and the drain region 56 are formed is formed so as to protrude in the present embodiment. That is, a channel width is assured in the height direction.

Still more, while the drain current 20 flowing between the source region 54 and the drain region 56 may be controlled by the height of the active region 18, the height of the active region 18 is designed high so as to fully assure a maximum value of the drain current 20. For example, even if the drain current 20 is controlled stepwise by controlling a quantity of charges stored in the charge storing layer 16 described later, a difference between the respective steps of the drain current 20 may be fully assured. Then, it becomes possible to readily read and discriminate information and to record or read multi-bit information by correlating theoretical valued to three or more bits ("0", "1" or "2" for example).

Specifically, the quantity of electric charges in the charge storing layer 16 is controlled in three states of: a first state in which the charges are stored by a first quantity of charges; a second state in which the charges are stored by a second quantity of charges that is lower than the first quantity of charges; and a third state in which no charge is stored. Upon this control, the value of the drain current 20 flowing between the source region 54 and the drain region 56 changes among three states of a first state in which the current is decreased, a second state in which the current flow semiconductor memory ore than the first state, and a third state in which the current flow semiconductor memory ore than the first and second states. It is then possible to read the bit information by reading the changes of the value of current.

It is noted that the mode of a single element (semiconductor non-volatile memory cell) has been explained in the present embodiment, the invention is not limited to that and is normally applied by arraying it. Because it becomes possible to record or read multi-bit information to/from one element (charge storing memory cell) in the present embodiment, it is possible to increase the information recording density per unit area by arraying the single element utilized as a non-volatile memory.

Still more, although the mode of providing the two charge storing layers 16 as shown in FIG. 9 has been explained in the present embodiment, it is also possible to adopt a mode of providing one charge storing layer.

The semiconductor memory fabricated by the method of the present invention is highly reliable because it can suppress the occurring of short-circuit between the gate electrodes as described above.

It is noted that the present embodiments should not be construed definitively and it is needless to say that they are realizable within a scope meeting with the requirements of the invention.

What is claimed is:

1. A method for fabricating a semiconductor memory having a semiconductor substrate having a concave portion and a convex portion, an element isolation region, a gate electrode and a charge storing layer, the method comprising:
   (a) forming the element isolation region in the concave portion of the semiconductor substrate;
   (b) forming a layer made of a gate electrode material so as to cover the concave portion of the semiconductor substrate and the element isolation region;
   (c) forming the gate electrode by forming a mask on a surface of the layer made of a gate electrode material so that a height from an upper surface of the convex portion to the surface of the mask is higher than a height from the surface of the element isolation region to the upper surface of the convex portion and by patterning the layer made of the gate electrode material;
   (d) forming the charge storing layer at on least one of side surfaces of the gate electrode in contact with the convex portion of the semiconductor substrate; and
   (e) forming a sidewall on at least a part of the charge storing layer.

2. The method for fabricating a semiconductor memory according to claim 1, wherein the layer made of the gate electrode material is formed so that a height from the upper surface of the convex portion to the upper surface of the layer made of the gate electrode material is higher than a height from the surface of the element isolation region to the upper surface of the convex portion.

3. The method for fabricating a semiconductor memory according to claim 1, wherein the convex portion includes a channel forming region, an extension forming region provided so as to sandwich the channel forming region, and source/drain forming regions provided so as to sandwich the channel forming region and the extension forming region;
   the forming of the gate electrode (c) includes forming the gate electrode on the channel forming region; and
   the forming of the sidewall (e) includes
   (e1) forming a sidewall material on the semiconductor substrate on which the charge storing layer is formed, and
   (e2) exposing the source/drain regions by anisotropic etching the sidewall material and the charge storing layer.

4. The method for fabricating a semiconductor memory according to claim 2, wherein the convex portion includes a channel forming region, an extension forming region provided so as to sandwich the channel forming region, and source/drain forming regions provided so as to sandwich the channel forming region and the extension forming region;
   the forming of the gate electrode (c) includes forming the gate electrode on the channel forming region; and
   the forming of the sidewall (e) includes
   (e1) forming a sidewall material on the semiconductor substrate on which the charge storing layer is formed, and
   (e2) exposing the source/drain regions by anisotropic etching the sidewall material and the charge storing layer.

5. The method for fabricating a semiconductor memory according to claim 3, further comprising:
   (f) forming an extension region in the extension forming region after the forming of the gate electrode (c) and before the forming of the charge storing layer (d); and
   (g) forming source/drain regions after the forming of the sidewall (e).

6. The method for fabricating a semiconductor memory according to claim 4, further comprising:
   (f) forming an extension region in the extension forming region after the forming of the gate electrode (c) and before the forming of the charge storing layer (d); and
   (g) forming source/drain regions after the forming sidewall (e).

* * * * *